(12) United States Patent
Kou et al.

(10) Patent No.: US 11,782,349 B2
(45) Date of Patent: Oct. 10, 2023

(54) METHODS OF DETERMINING CORRECTIONS FOR A PATTERNING PROCESS, DEVICE MANUFACTURING METHOD, CONTROL SYSTEM FOR A LITHOGRAPHIC APPARATUS AND LITHOGRAPHIC APPARATUS

(71) Applicant: ASML NETHERLANDS B.V., Veldhoven (NL)

(72) Inventors: Weitian Kou, Eindhoven (NL); Alexander Ypma, Veldhoven (NL); Marc Hauptmann, Turnhout (BE); Michiel Kupers, Roermond (NL); Lydia Marianna Vergaij-Huizer, Eindhoven (NL); Erik Johannes Maria Wallerbos, Helmond (NL); Erik Henri Adriaan Delvigne, Breda (NL); Willem Seine Christian Roelofs, Deurne (NL); Hakki Ergün Cekli, Singapore (SG); Stefan Cornelis Theodorus Van Der Sanden, Nijmegen (NL); Cédric Désiré Grouwstra, Eindhoven (NL); David Frans Simon Deckers, Turnhout (BE); Manuel Giollo, Eindhoven (NL); Iryna Dovbush, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 18/100,662

(22) Filed: Jan. 24, 2023

(65) Prior Publication Data
US 2023/0168591 A1    Jun. 1, 2023

Related U.S. Application Data

(63) Continuation of application No. 17/715,112, filed on Apr. 7, 2022, now Pat. No. 11,592,753, which is a
(Continued)

(30) Foreign Application Priority Data

Oct. 21, 2016   (EP) ................................. 16195047
Jan. 9, 2017    (EP) ................................. 17150658
(Continued)

(51) Int. Cl.
    *G03F 7/20*    (2006.01)
    *G03F 7/00*    (2006.01)

(52) U.S. Cl.
    CPC .......... *G03F 7/70508* (2013.01); *G03F 7/705* (2013.01); *G03F 7/70633* (2013.01)

(58) Field of Classification Search
    CPC .. G03F 7/70508; G03F 7/705; G03F 7/70633; G03F 7/70525; G03F 7/70616; G05B 19/18; G05B 19/41875
    See application file for complete search history.

(56) References Cited

U.S. PATENT DOCUMENTS 6,638,778 B1   10/2003   Peterson et al.
9,087,176 B1   7/2015    Chang et al.
(Continued)

FOREIGN PATENT DOCUMENTS

CN    1629729      6/2005
CN    102207683    10/2011
(Continued)

OTHER PUBLICATIONS

International Search Report and Written Opinion issued in corresponding PCT Patent Application No. PCT/EP2017/074643, dated Nov. 23, 2017.
(Continued)

*Primary Examiner* — Mesfin T Asfaw
(74) *Attorney, Agent, or Firm* — Pillsbury Winthrop Shaw Pittman, LLP

(57) ABSTRACT

A method of determining a correction for a process parameter related to a lithographic process, wherein the litho-
(Continued)

graphic process includes a plurality of runs during each one of which a pattern is applied to one or more substrates. The method of determining includes obtaining pre-exposure metrology data describing a property of a substrate; obtaining post-exposure metrology data comprising one or more measurements of the process parameter having been performed on one or more previously exposed substrates; assigning, based on the pre-exposure metrology data, a group membership status from one or more groups to the substrate; and determining the correction for the process parameter based on the group membership status and the post-exposure metrology data.

20 Claims, 6 Drawing Sheets

Related U.S. Application Data continuation of application No. 17/102,850, filed on Nov. 24, 2020, now Pat. No. 11,327,407, which is a continuation of application No. 16/335,277, filed as application No. PCT/EP2017/074643 on Sep. 28, 2017, now Pat. No. 10,877,381.

(30) Foreign Application Priority Data

Feb. 1, 2017 (EP) .................................... 17154129
Aug. 23, 2017 (EP) .................................... 17187411

(56) References Cited

U.S. PATENT DOCUMENTS

| | | |
|---|---|---|
| 2004/0017575 A1 | 1/2004 | Balasubramanian et al. |
| 2005/0075819 A1 | 4/2005 | Paxton et al. |
| 2014/0353527 A1 | 12/2014 | MacNaughton et al. |
| 2015/0212429 A1 | 7/2015 | MacNaughton et al. |
| 2015/0227654 A1 | 8/2015 | Hunsche et al. |
| 2015/0302312 A1 | 10/2015 | Vukkadala et al. |
| 2016/0062252 A1 | 3/2016 | Veeraraghavan et al. |
| 2016/0313651 A1 | 10/2016 | Middlebrooks et al. |
| 2017/0160648 A1 | 6/2017 | Tel et al. |
| 2017/0363969 A1 | 12/2017 | Hauptmann et al. |

FOREIGN PATENT DOCUMENTS

| | | |
|---|---|---|
| CN | 105849643 | 8/2016 |
| EP | 3005411 | 12/2018 |
| JP | 2004342951 | 12/2004 |
| JP | 200594015 | 4/2005 |
| JP | 2005094015 | 4/2005 |
| JP | 2017505460 | 2/2017 |
| KR | 20160098446 | 8/2016 |
| TW | 201530333 | 8/2015 |
| TW | 201621472 | 6/2016 |
| WO | 2015049087 | 4/2015 |
| WO | 2015090774 | 6/2015 |
| WO | 2016087069 | 6/2015 |
| WO | 2016087069 | 6/2016 |

OTHER PUBLICATIONS

Taiwanese Office Action issued in corresponding Taiwanese Patent Application No. 106135524, dated Aug. 29, 2018.
Chinese Office Action issued in corresponding Chinese Patent Application No. 201780065318.X, dated Aug. 3, 2020.
Korean Office Action issued in corresponding Korean Patent Application No. 10-2019-701224, dated Jun. 1, 2020.
Japanese Office Action issued in corresponding Japanese Patent Application No. 2019-515497, dated Feb. 19, 2020.
Taiwanese Office Action issued in corresponding Taiwanese Patent Application No. 109104361, dated Jan. 13, 2021.
Taiwanese Office Action issued in corresponding Taiwanese Patent Application No. 110120349, dated May 25, 2022.

METHODS OF DETERMINING CORRECTIONS FOR A PATTERNING PROCESS, DEVICE MANUFACTURING METHOD, CONTROL SYSTEM FOR A LITHOGRAPHIC APPARATUS AND LITHOGRAPHIC APPARATUS

This application is a continuation of U.S. patent application Ser. No. 17/715,112, filed Apr. 7, 2022, which is a continuation of U.S. patent application Ser. No. 17/102,850, filed Nov. 24, 2020, which is a continuation of U.S. patent application Ser. No. 16/335,277, filed Mar. 21, 2019, which is a U.S. national phase entry of PCT patent application no. PCT/EP2017/074643, filed on Sep. 28, 2017, which claims the benefit of priority of European patent application no. 16195047.2, filed on Oct. 21, 2016, of European patent application no. 17150658.7, filed on Jan. 9, 2017, of European patent application no. 17154129.5, filed on Feb. 1, 2017, and of European patent application no. 17187411.8, filed on Aug. 23, 2017, each of the foregoing applications is incorporated herein in its entirety by reference.

FIELD

The present description relates to control apparatus and control methods usable, for example, to maintain performance in the manufacture of devices by patterning processes such as lithography. The invention further relates to methods of manufacturing devices using lithographic techniques. The invention yet further relates to computer program products for use in implementing such methods.

BACKGROUND

A lithographic process is one in which a lithographic apparatus applies a desired pattern onto a substrate, usually onto a target portion of the substrate, after which various processing chemical and/or physical processing steps work through the pattern to create functional features of a complex product. The accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. So-called advanced alignment models have been and continue to be developed to model and correct more accurately non-linear distortions of the wafer 'grid' that are caused by processing steps and/or by the lithographic apparatus itself. Not all distortions are correctable, however, and it remains important to trace and eliminate as many causes of such distortions as possible.

Modern lithographic process and products are so complex that issues due to processing are difficult to trace back to the root cause. Overlay and alignment residuals typically show patterns over the wafer (of the process and/or litho tool). This may be interpreted as a non-correctable quantity with respect to a predefined model, while visual inspection and detailed analysis of the fingerprint may give an indication of causes and correction strategies. The spatial pattern in the fingerprint is not used to quantify the fingerprint, nor the observation that multiple causes may show up simultaneously in the apparent fingerprint. Overlay measurements are not generally available for each individual wafer, and the relation to the processing history and context is not generally known or used. Furthermore, it is difficult and time-consuming to make a list of all possible sources of spatial variation for the machine and process at hand.

Aside from the problem of identifying causes of processing errors, process performance monitoring systems have been implemented which allow measurement of performance parameters to be made from processed products, which then are used to calculate corrections for use in processing subsequent products. A limitation with current performance monitoring systems is that there is a compromise between the amount of time and equipment dedicated to performance monitoring, and the speed and accuracy with which corrections can be implemented. In a "run-to-run" control strategy historic performance measurements are fed back to calculate new process corrections using (e.g., in-line) metrology performed between and/or during "runs", which may comprise one or more lots. In previous run-to-run control strategies, each run comprised a "lot" of, typically 25 substrates. Improved lithographic apparatus hardware has enabled wafer level control, whereby a run may comprise a single substrate. However, performing a full overlay measurement on each substrate to take advantage of such wafer level control would be prohibitive in term of time and throughput.

SUMMARY

Embodiments of the present invention aim to improve systems for control of performance in parameters such as overlay in lithographic processes. Embodiments aim to enable optimization of run-to run control strategies during high-volume manufacture.

According to an aspect, there is provided a method of determining a correction for a process parameter related to a lithographic process on a substrate, the lithographic process comprising a plurality of runs during each one of which a pattern is applied to one or more substrates, the method comprising: obtaining pre-exposure parameter data relating to a property of the substrate; obtaining post-exposure metrology data comprising one or more measurements of the process parameter having been performed by an equivalent lithographic process on one or more previously exposed substrates of the lithographic process; assigning to the substrate, a group membership status from one or more groups, based on the pre-exposure parameter data; and determining the correction for the process parameter based on the group membership status and the post-exposure metrology data.

In an aspect, there is provided a method of manufacturing devices wherein device features are formed on a series of substrates by a patterning process, wherein corrections for a process parameter of the patterning process are determined by performing a method as described herein.

In an aspect, there is provided a control system for a lithographic apparatus, the control system comprising: storage for receiving pre-exposure parameter data relating to a property of a substrate and post-exposure metrology data comprising one or more measurements of the process parameter having been performed on one or more previous substrates; and a processor operable to: assign to the substrate, a group membership status from one or more groups, based on the pre-exposure parameter data; and determine a correction for a process parameter based on the group membership status and the post-exposure metrology data.

In an aspect, there is provided a lithographic apparatus including a control system as described herein.

In an aspect, there is provided a method of dynamically updating one or more groups and/or corrections for a process parameter related to a lithographic process on a substrate, wherein a correction out of a plurality of corrections is applied to the process parameter for each substrate based on a group membership status assigned to that substrate the method comprising: obtaining post-exposure metrology data describing a performance parameter of the substrate; and dynamically updating the one or more of the groups and/or plurality of corrections based on the post-exposure metrology data.

In an aspect, there is provided a computer program product containing one or more sequences of machine-readable instructions for implementing calculating steps in a method as described herein.

These and other aspects and advantages of the apparatus and methods disclosed herein will be appreciated from a consideration of the following description and drawings of exemplary embodiments.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Before describing embodiments of the invention in detail, it is instructive to present an example environment in which embodiments of the present invention may be implemented.

Figure 1:
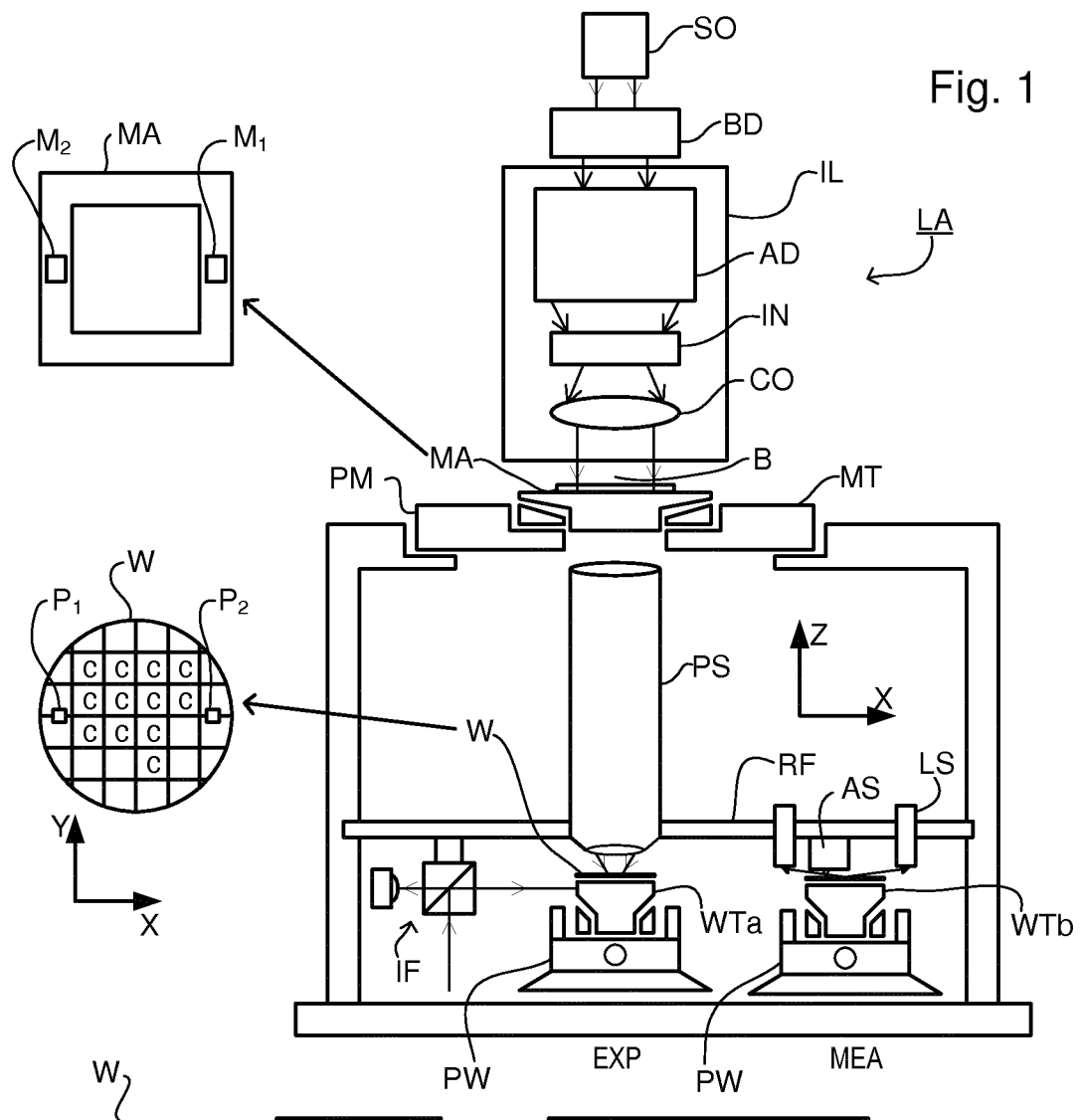
FIG. 1 depicts a lithographic apparatus suitable for use in an embodiment of the present invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; two substrate tables (e.g., a wafer table) WTa and WTb each constructed to hold a substrate (e.g., a resist coated wafer) W and each connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W. A reference frame RF connects the various components, and serves as a reference for setting and measuring positions of the patterning device and substrate and of features on them.

The illumination system may include various types of optical components, such as refractive, reflective, magnetic, electromagnetic, electrostatic or other types of optical components, or any combination thereof, for directing, shaping, or controlling radiation. For example, in an apparatus using extreme ultraviolet (EUV) radiation, reflective optical components will normally be used.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support MT may be a frame or a table, for example, which may be fixed or movable as required. The patterning device support may ensure that the patterning device is at a desired position, for example with respect to the projection system.

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

As here depicted, the apparatus is of a transmissive type (e.g., employing a transmissive patterning device). Alternatively, the apparatus may be of a reflective type (e.g., employing a programmable mirror array of a type as referred to above, or employing a reflective mask). Examples of patterning devices include masks, programmable mirror arrays, and programmable LCD panels. Any use of the terms "reticle" or "mask" herein may be considered synonymous with the more general term "patterning device." The term "patterning device" can also be interpreted as referring to a device storing in digital form pattern information for use in controlling such a programmable patterning device.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems.

In operation, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may for example include an adjuster AD for adjusting the angular intensity distribution of the radiation beam, an integrator IN and a condenser CO. The illuminator may be used to condition the radiation beam, to have a desired uniformity and intensity distribution in its cross section.

The radiation beam B is incident on the patterning device MA, which is held on the patterning device support MT, and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa or WTb can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment marks may also be included within dies, in amongst the device features, in which case it is desirable that the markers be as small as possible and it is desirable that they do not require any different imaging or process conditions than adjacent features. The alignment system, which detects the alignment markers, is described further below.

The depicted apparatus could be used in a variety of modes. In a scan mode, the patterning device support (e.g., mask table) MT and the substrate table WT are scanned synchronously while a pattern imparted to the radiation beam is projected onto a target portion C (i.e., a single dynamic exposure). The speed and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion. Other types of lithographic apparatus and modes of operation are possible, as is well-known in the art. For example, a step mode is known. In so-called "maskless" lithography, a programmable patterning device is held stationary but with a changing pattern, and the substrate table WT is moved or scanned.

Combinations and/or variations on the above described modes of use or entirely different modes of use may also be employed.

Lithographic apparatus LA is of a so-called dual stage type which has two substrate tables WTa, WTb and two stations—an exposure station EXP and a measurement station MEA—between which the substrate tables can be exchanged. While one substrate on one substrate table is being exposed at the exposure station, another substrate can be loaded onto the other substrate table at the measurement station and various preparatory steps carried out. This enables a substantial increase in the throughput of the apparatus. On a single stage apparatus, the preparatory steps and exposure steps need to be performed sequentially on the single stage, for each substrate. The preparatory steps may include mapping the surface height contours of the substrate using a level sensor LS and measuring the position of alignment markers on the substrate using an alignment sensor AS. If the position sensor IF is not capable of measuring the position of the substrate table while it is at the measurement station as well as at the exposure station, a second position sensor may be provided to enable the positions of the substrate table to be tracked at both stations, relative to reference frame RF. Other arrangements are known and usable instead of the dual-stage arrangement shown. For example, other lithographic apparatuses are known in which a substrate table and a measurement table are provided. These are docked together when performing preparatory measurements, and then undocked while the substrate table undergoes exposure.

Figure 2:
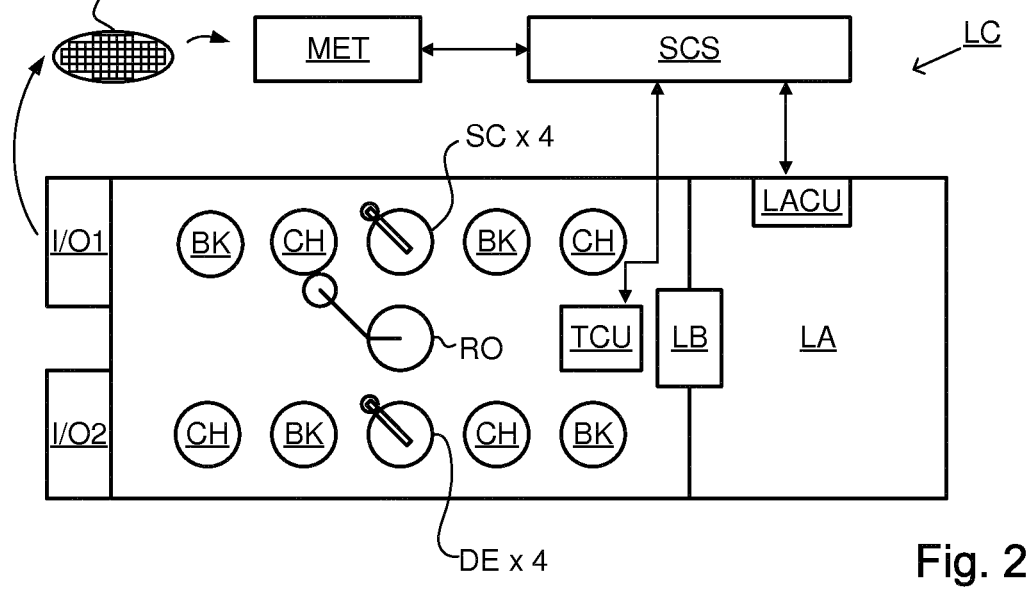
FIG. 2 depicts a lithographic cell or cluster in which an inspection apparatus according to an embodiment may be used.

As shown in FIG. 2, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it may be desirable that the inspection apparatus measure properties in the exposed resist layer immediately after the exposure. However, not all inspection apparatus have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

The metrology step with metrology system MET can also be done after the resist pattern has been etched into a product layer. The latter possibility limits the possibilities for rework of faulty substrates but may provide additional information about the performance of the manufacturing process as a whole.

Figure 3:
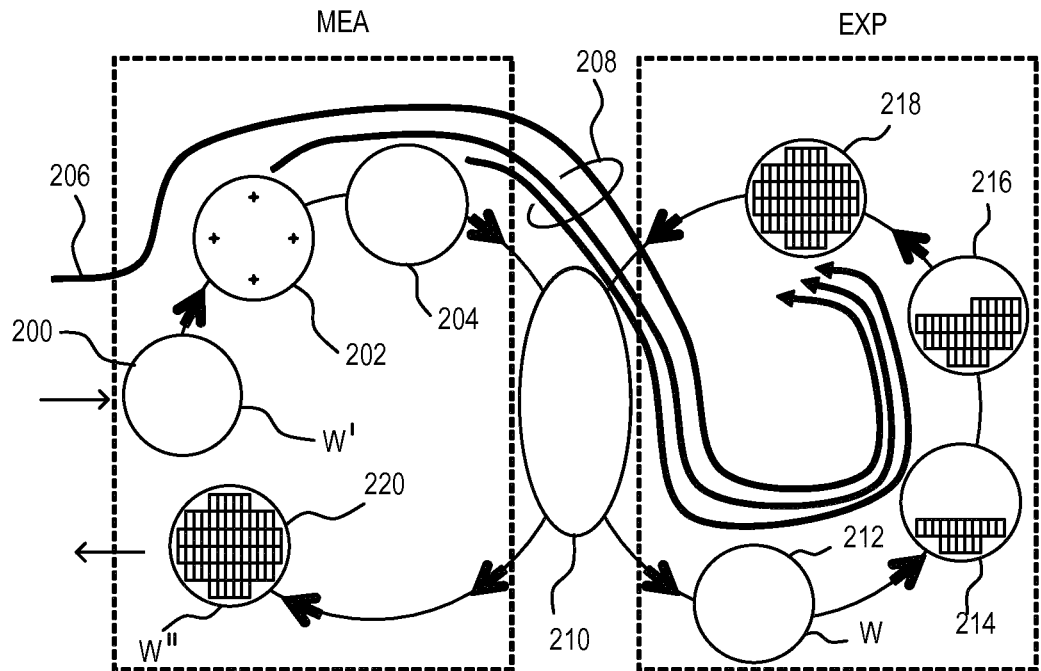
FIG. 3 illustrates schematically measurement and exposure processes in the apparatus of FIG. 1, according to known practice.

FIG. 3 illustrates the steps to expose target portions (e.g. dies) on a substrate W in the dual stage apparatus of FIG. 1. The process according to conventional practice will be described first. The present disclosure is by no means limited to dual stage apparatus of the illustrated type. The skilled person will recognize that similar operations are performed in other types of lithographic apparatus, for example those having a single substrate stage and a docking metrology stage.

On the left hand side within a dotted box are steps performed at measurement station MEA, while the right hand side shows steps performed at exposure station EXP. From time to time, one of the substrate tables WTa, WTb will be at the exposure station, while the other is at the measurement station, as described above. For the purposes of this description, it is assumed that a substrate W has already been loaded into the exposure station. At step 200, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. Each patterning step can introduce positional deviations in the applied pattern, while subsequent processing steps progressively introduce distortions in the substrate and/or the pattern applied to it that must be measured and corrected for, to achieve satisfactory overlay performance.

The previous and/or subsequent patterning step may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation. Some layers may be patterned by steps that are alternative or supplementary to exposure in the illustrated lithographic apparatus. Such alternative and supplementary techniques include for example imprint lithography, self-aligned multiple patterning and directed self-assembly. Similarly, other processing steps performed per layer (e.g., CMP and etch) may be performed on different apparatuses per layer.

At 202, alignment measurements using the substrate marks P1 etc. and image sensors (not shown) are used to measure and record alignment of the substrate relative to substrate table WTa/WTb. In addition, several alignment marks across the substrate W' will be measured using alignment sensor AS. These measurements are used in one embodiment to establish a substrate model (sometimes referred to as the "wafer grid"), which maps very accurately the distribution of marks across the substrate, including any distortion relative to a nominal rectangular grid.

At step 204, a map of wafer height (Z) against X-Y position is measured also using the level sensor LS. Primarily, the height map is used only to achieve accurate focusing of the exposed pattern. It may be used for other purposes in addition.

When substrate W' was loaded, recipe data 206 were received, defining the exposures to be performed, and also properties of the wafer and the patterns previously made and to be made upon it. Where there is a choice of alignment marks on the substrate, and where there is a choice of settings of an alignment sensor, these choices are defined in an alignment recipe among the recipe data 206. The alignment recipe therefore defines how positions of alignment marks are to be measured, as well as which marks.

At 210, wafers W' and W are swapped, so that the measured substrate W' becomes the substrate W entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WTb (formerly WTa) can be all that is necessary to make use of the measurement information 202, 204 for the substrate W (formerly W') in control of the exposure steps. At step 212, reticle alignment is performed using the mask alignment marks M1, M2. In steps 214, 216, 218, scanning motions and radiation pulses are applied at successive target locations across the substrate W, in order to complete the exposure of a number of patterns.

By using the alignment data and height map obtained at the measuring station in the performance of the exposure steps, these patterns are accurately aligned with respect to the desired locations, and, in particular, with respect to features previously laid down on the same substrate. The exposed substrate, now labeled W" is unloaded from the apparatus at step 220, to undergo etching or other processes, in accordance with the exposed pattern.

Figure 4:
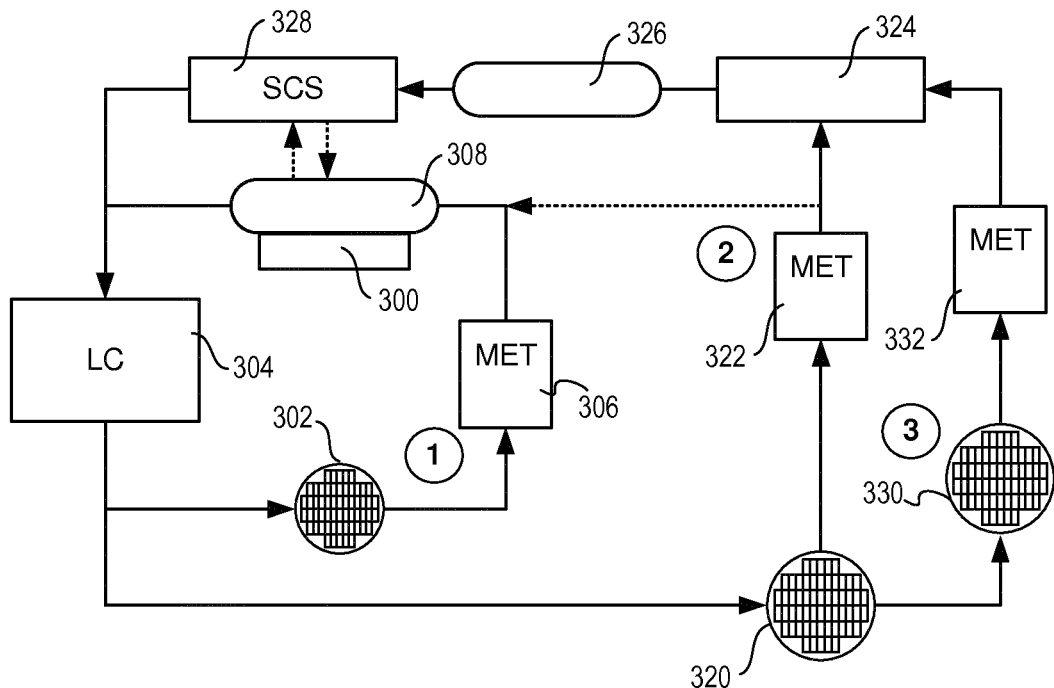
FIG. 4 is a schematic diagram of an advanced process control method for controlling the apparatus of FIG. 1 according to known practice.

For best performance, historical performance data relating to the lithography process are generally used in addition to measurements made when a current substrate is loaded into the lithographic apparatus. For this purpose, measurements of performance are made with the metrology system MET (FIG. 2). Different forms of advanced process control can be implemented. FIG. 4 illustrates only one example, implementing a known stability control method.

FIG. 4 depicts a stability module 300. This module is for example an application running on a processor, for example within the control unit LACU or the supervisory control system SCS of FIG. 2. Shown are three main process control loops, labeled 1, 2, 3. The first loop provides local control of the lithography apparatus using the stability module 300 and monitor wafers. A monitor wafer 302 is shown being passed from a lithography cell 304, which may be the lithocell LC of FIG. 2 for example. Monitor wafer 304 has been exposed with a calibration pattern to set 'baseline' parameters for focus and overlay. At a later time, a metrology tool 306 reads these baseline parameters, which are then interpreted by the stability module 300 so as to calculate stability corrections 308 specific to this lithocell. This performance data can be fed back to the lithography cell 304, and used when performing further exposures. The exposure of the monitor wafer may involve printing a pattern of marks on top of reference marks. By measuring overlay error between the top and bottom marks, deviations in performance of the lithographic apparatus can be measured, even when the wafers have been removed from the apparatus and placed in a metrology tool.

The second (APC) control loop is based on measurements of performance parameters such as focus, dose, and overlay on actual product wafers. An exposed product wafer 320 is passed to metrology tool 322, which may be the same or different to the metrology tool 306 in the first control loop. At 322 information relating for example to parameters such as critical dimension, sidewall angles and overlay is determined and passed to an Advanced Process Control (APC) module 324. This data is also passed to the stability module 300. Process corrections 326 are calculated and used by the supervisory control system (SCS) 328, providing control of the lithocell 304, in communication with the stability module 300.

The third control loop is to allow metrology integration into the second (APC) control loop, for example in double patterning applications. An etched wafer 330 is passed to metrology unit 332 which again may be the same or different to the metrology tool 306, 322 used in the first and/or second control loop. Metrology tool 332 measures performance parameters such as critical dimensions, sidewall angles and overlay, read from the wafer. These parameters are passed to the Advanced Process Control (APC) module 324. The loop continues the same as with the second loop.

Current process correction strategies in a high volume manufacturing (HVM) environment are typically performed on a per chuck and per lot basis. However, more recently a per substrate correction is considered. It then becomes possible to define process corrections per substrate instead of per lot. Practical strategies for taking advantage of a per substrate correction for process control at the per substrate level (herein referred to as wafer level control or WLC) need to be devised. It is expensive (particularly in terms of time and throughput) to perform overlay metrology for each processed substrate. Instead, a per substrate prediction of the "process fingerprint" can be made. The process fingerprint (or signature) describes the distortion or other deformations imposed on a substrate by a particular process step and/or process tool. Such predictions could be based on the exposure sequence (which is known in advance) or the context/processing history. However, this has some disadvantages. Firstly, keeping track of and managing all historic processing steps, especially for a higher layer, involves significant effort. Secondly, it may be difficult to establish a clear relationship between process tools and the impact on overlay.

Using metrology data which is generally generated on a more regular basis, for example alignment data or levelling data which is generated on a per substrate basis, is an alternative to reduce substrate-to-substrate variations. However, considering specifically the example of alignment data, the correction capacity is limited: to avoid a throughput penalty only a limited number of alignment marks can be measured; the alignment model is often limited to a global (interfield) model; and often the alignment marks suffer from process-induced mark damage, resulting in less reliable measurements.

It is proposed to group substrates together and determine a correction based on the substrate group in a run-to-run, wafer level control strategy. In the HVM environment, the cluster assignment could be performed according to the context history of the substrates. However, as already described, tracking context history is undesirably burdensome. Instead, it is proposed to group substrates according to pre-exposure parameter data (e.g., pre-exposure metrology data) which correlates with a post-exposure performance parameter (e.g., overlay) being controlled. By grouping the substrates in this way, it is possible to achieve close to a "per substrate" accuracy while benefitting from relatively large averaging across the substrates per group.

In this context, pre-exposure metrology data comprises metrology data from measurements performed prior to exposure of the layer for which the performance parameter is being controlled, i.e., the term "pre-exposure" is relative to exposure of the next layer. As such, pre-exposure metrology data may comprise measurements performed on a substrate on which previous layers have been exposed, for control of exposure of a further layer on the substrate.

Pre-exposure data may comprise data from measurements performed prior to loading on the lithographic apparatus (scanner) for exposure of the current layer, or subsequent to loading on the lithographic apparatus (scanner) for exposure of the current layer. In the latter example, the pre-exposure data may comprise preparatory metrology for the exposure of that layer. In an embodiment, the pre-exposure metrology data may comprise alignment data. The alignment data may comprise measurements performed in preparation for exposure of the current layer subsequent to loading of the substrate. Alternatively, or in combination, the alignment data may comprise measurements performed in preparation for exposure of a previous layer, i.e., prior to loading of the substrate for measurement and exposure of the current layer. Alternatively, or in combination, the pre-exposure metrology data may comprise levelling data describing the shape of the substrate. As with alignment data, the levelling data may be from measurements performed in preparation for exposure of the current layer, or of previous layers. Alternatively, or in combination, the pre-exposure metrology data may comprise wafer geometry data and/or in-plane distortion data.

Considering the example of the pre-exposure metrology data comprising alignment data, this alignment data may be measured across a substrate at the measurement station of the lithography tool. The alignment data may comprise a plurality of vectors across the substrate, each vector representing the position and displacement of a mark position measured by the alignment sensor AS, relative to a nominal position (e.g., a positional deviation), for a particular mark on the substrate. All the substrates may have the same spatial distribution of marks and measurements, but the actual deviations are generally unique to each substrate. Analysis of the pre-exposure metrology data (alignment measurements) over a population of substrates can be performed so as to reveal various "fingerprints" that may be hidden in the data. Similarly, fingerprints can be obtained from a substrate topography or shape measurement measured, for example, using level sensor LS. It is known that any of the different steps in the production of the processed substrate can contribute its own fingerprint to the distribution of position errors across the substrate. Bearing in mind that a real product may have gone through dozens of process steps, including many cycles of patterning and processing in different apparatuses and different types of apparatuses, it becomes very difficult to know which types of apparatus, let alone which individual apparatuses, have contributed to errors present in the finished product.

The proposed method may comprise two phases. An initial set-up or training phase is performed in order to categorize a set of substrates into plural groups. This set-up phase may comprise training a classifier to categorize the pre-exposure metrology data (input objects) according to (e.g., labelled by) characteristics of the performance parameter (output). Any suitable (e.g., supervised, semi-supervised or unsupervised) machine learning technique for hard or soft classification of data may be used, for example linear discriminant analysis, logistic regression, a support vector classifier or principal component analysis (PCA). Other suitable classification methods are described in PCT patent application publication no. WO2015049087, herein incorporated by reference. This describes methods where alignment data or other measurements are made at stages during the performance of a lithographic process to obtain object data representing positional deviation or other parameters measured at points spatially distributed across each wafer. This object data is used to obtain diagnostic information by performing a multivariate analysis to decompose the set of the vectors representing the wafers in the multidimensional space into one or more component vectors. Diagnostic information about the industrial process is extracted using the component vectors. The performance of the lithographic process for subsequent product units can be controlled based on the extracted diagnostic information.

The training phase may be performed on historical data from a plurality of substrates for which the pre-exposure metrology data and post-exposure metrology data (measurements of the performance parameter) are available. For the specific examples already mentioned, alignment fingerprints (which describe substrate grid distortion in the substrate plane) or substrate shapes or topographies (which describe substrate distortions in the direction normal to the substrate plane) and are classified according to a characteristic of corresponding overlay measurements (for example an overlay fingerprint characteristic). The result of this training phase may comprise a plurality of substrate groups, each labelled by a common fingerprint or topography characteristic and corresponding coefficients. Each performance parameter characteristic will have an associated process correction (e.g., an optimal correction recipe). In an embodiment, the set-up phase may coincide with normal production (the control phase, based on lot based process correction).

Figure 5:
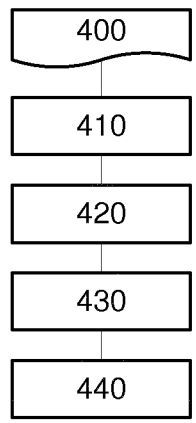
FIG. 5 is a flowchart describing an initial set-up phase according to an embodiment of the invention.

FIG. 5 is a flowchart describing a specific example of the training phase for predictive substrate classification. The set-up phase may comprise using a supervised learning algorithm on (e.g., historic) training data 400 comprising pre-exposure metrology data for a number of substrates labelled by post-exposure metrology data describing the performance parameter for those substrates. As there will typically be much more pre-exposure metrology data available than post-exposure metrology data, the set-up phase may comprise using a semi-supervised learning algorithm where only a few substrates are labeled (the substrates measured post-exposure), while the substrates only measured pre-exposure are unlabeled. Such semi-supervised classification may use label-spreading methods, for example. In a specific example, the pre-exposure metrology data may comprise alignment fingerprints or substrate topographies and the post-exposure metrology data may comprise overlay, critical dimension or focus fingerprints. Firstly, an intra-lot clustering step 410 is performed to identify per-lot clusters/groups. Following this, an inter-lot clustering step 420 is performed to identify similar fingerprints/topologies between lots. A classification step 430 is then performed to train a classifier using the training data. During this step, pre-exposure metrology data groups (i.e., the substrate groups) are defined. A validation step 440 is then performed. In this validation step 440, substrates are assigned to the substrate groups based upon historical data. A shadow mode simulation of performance parameter benefit is then performed per process correction thread.

In a second phase or control phase, pre-exposure metrology data for a substrate is obtained, for example by performing alignment and/or levelling metrology on the substrate. This metrology may be performed in a lithographic apparatus as part of an alignment and substrate measuring process; for example using, respectively, the alignment sensor AS and level sensor LS of FIG. 1 by the methods described above. Based on this pre-exposure metrology data, the substrate is assigned a group membership status. The group membership status may comprise each of the substrates being assigned membership of a single group (hard classification) or partial membership of some or all groups (soft classification; e.g., using a softmax function). In either case, the groups will be one of the substrate groups determined during the set-up phase (or possibly determined during this control phase as will be described later). The pre-exposure metrology data may comprise measurement of any common physical property for all substrates which is sensitive to substrate process variations; for example: an alignment fingerprint or substrate topography or flatness measurement. Based on the group membership status, an associated process correction will be identified. This associated process correction may then be used during exposure of the layer being exposed.

In an embodiment, the pre-exposure metrology on the substrate and the subsequent categorization of the substrate, identification of associated corrections and exposure of the layer using the corrections are all performed by the lithographic apparatus. This will mean that the correction loop will be short (the pre-exposure metrology data is directly used in the subsequent exposure step). No additional tool to measure the substrate is needed.

In an embodiment, where the lithographic apparatus comprises more than one support (more than one chuck) as illustrated in FIG. 1, the chuck assignment may be taken into account when identifying corrections based on the substrate categorization. As such, corrections may be associated to a particular substrate group on a per chuck basis.

The performance parameter (e.g., overlay) will be measured post-exposure on some or all of the substrates. The resulting metrology data can then be modeled and the parameters used to update or replace the process corrections associated with the substrate groups applicable to the measured substrates. Process correction updates may be implemented with a time filter and/or averaged (e.g. using a moving average). The modeling may be done once for every substrate group. Alternatively, the modeling may comprise modeling all the parameters at once using both class-specific and shared parameters.

In an embodiment, during the control phase, it may be determined that the pre-exposure metrology data for a particular substrate does not properly belong to any of the substrate groups identified in the training phase, according to a metric. For example, the metric may be a distance metric, and a particular substrate may be deemed to not properly belong to any substrate group if the distance metric to the nearest substrate group is above a threshold value. In a specific example, the distance metric may refer to the distance between the measured alignment fingerprint (or other pre-exposure metrology data) of a substrate and the metrology fingerprint defining the closest group. In such an embodiment, the method may comprise updating the substrate groups by updating the corresponding characteristic which characterizes one or more of the substrate groups such that one of the substrate groups now encompasses the characteristic of the pre-exposure metrology data for this substrate. In this way, the characteristic of each substrate group can be updated while maintaining consistency in the number of groups. By way of an alternative, an embodiment may comprise adding a new group corresponding to a characteristic of the pre-exposure metrology data for the uncategorized substrate. The performance parameter (e.g., overlay) for this substrate would then be measured post-exposure and used to label the pre-exposure metrology data for the uncategorized substrate. Also, corresponding corrections should be determined for the new substrate group (e.g., by modeling), which can then be used for correcting subsequent substrates that are categorized in this group. By way of an alternative, substrates which do not fit any group may be reworked and set aside.

The selection of substrates for post-exposure measurement may be optimized during the control phase. This optimization may comprise selecting substrates which are identified as being the most representative of its corresponding substrate group. This may comprise selecting a substrate for which its associated distance metric used in its categorization is smaller than the distance metrics of the other substrates in the group. However, substrate selection based solely on representativeness may cause some groups to be updated more often than others. Therefore, in another embodiment, substrates may be selected based on a combination of representativeness and how recently the corresponding correction set was last updated.

Figure 6:
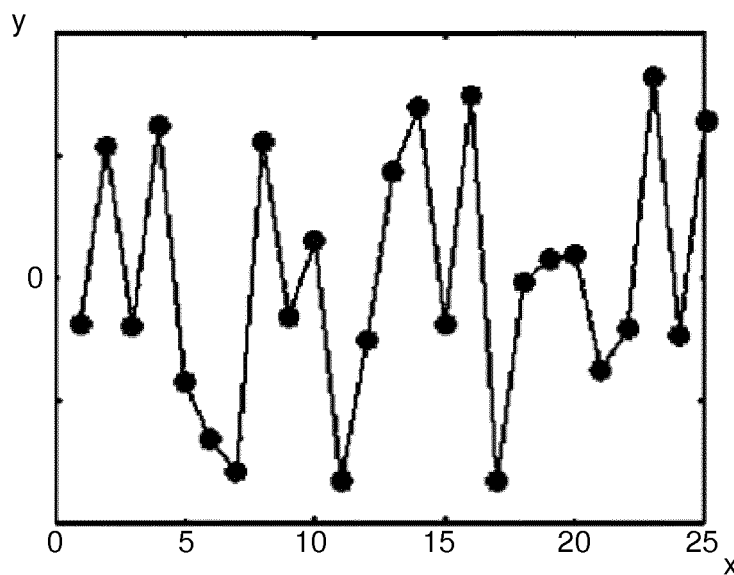
FIG. 6 is a plot of the score attributed to each substrate of a lot with respect to a first eigenwafer fingerprint.

As already described, with hard classification at least, the substrates are "binned" in pre-defined groups, with group based corrections then applied uniformly to each member of the group. In such embodiments, the classification/clustering can be performed by statistical tools such as Principal Component Analysis (PCA) using inline or offline data from the scanner or other metrology tools. However, in practice, the distinction between groups is often not trivial and therefore binning is not preferred. This is illustrated by the example graph of FIG. 6. This is a plot of a PCA score value on the y-axis against substrate (x-axis) for a lot of 25 substrates with respect to a particular eigenwafer (an eigenfingerprint or principal component). To obtain the plot, PCA was performed on substrate alignment data (pre-exposure metrology data) of a lot (25 substrates). The most dominant fingerprint was then identified (the first eigenwafer or first eigenfingerprint) and the graph plots the score value for this eigenwafer per measured substrate (i.e. a measure of the presence of the eigenfingerprint in each substrate). It can be seen from FIG. 6 that there is no clear clustering of the substrates; the spread of the substrates being more continuous than this. This can result in an essentially arbitrary classification for some substrates.

It is therefore proposed, in this embodiment, to improve the correction using a weighted classification based on a classification score. The weighted classification improves the per-substrate correction by weighting each correction using the score values of substrates found by PCA. In such an embodiment, each eigenwafer identified may represent a different group in the classification. In an embodiment, not all identified eigenwafers define a separate group. For example, one or more of the least dominant eigenwafers (eigenfingerprints/principal components) may be ignored when defining the groups. The set-up phase may be largely as already has been described, but specifically using a classification technique, an example of which is PCA, which provides scores for each substrate in terms of the group (eigenwafer), e.g., a measure of its degree of membership within that group (which can be positive as well as negative). Other examples of suitable statistical classification methods which assign weights or scores to a member of a group comprise: Random Forest, Bayesian networks, neural networks, linear discriminant analysis. The pre-exposure metrology data and post-exposure metrology data may comprise data as already described in other embodiments. In an embodiment the weighting, based on the score value, may be applied to (e.g., multiplied with) the overlay (or other process parameter) fingerprint correction to provide a weighted correction.

Figure 7:
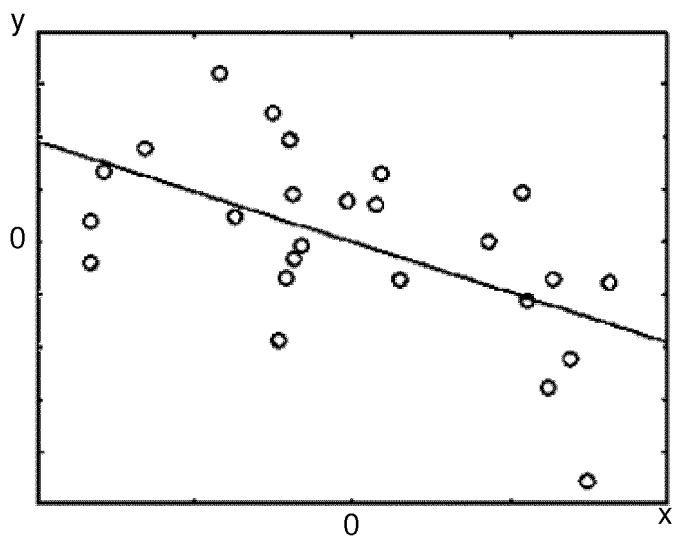
FIG. 7 is a graph, for an eigenwafer, of the score attributed to measured overlay fingerprints (y-axis) against measured alignment fingerprints (x-axis) for a lot of (25) substrates, where each point represents a different substrate.

FIG. 7 is a graph, for a particular group or eigenwafer, of the score attributed to post-exposure metrology data (y-axis) such as measured overlay fingerprints against pre-exposure metrology data (x-axis) such as measured alignment fingerprints. Each point represents a different substrate of a lot of (25) substrates. What is evident is that there is a correlation between score values for the post-exposure metrology data and pre-exposure metrology data. This correlation shows that the scores attributable to the pre-exposure metrology data (e.g., alignment data) can be used to determine optimal corrections for wafer level control. Note that the better this correlation, the better the predicted overlay correction will be.

It should be noted that in such an embodiment, only one group needs to be defined. While technically this may be true for hard classification, the results would be essentially meaningless as each substrate could only be assigned to that single group and therefore could not be distinguished. However, in this embodiment the weighting, based on the score value, would mean that different corrections may be applied based on the pre-exposure metrology data regardless of whether there is only one group (e.g., a single, most dominant, eigenwafer) or more than one group defined. Where there is more than one group defined, the correction applied to a substrate may be that applicable to the group of which the substrate is assigned, weighted according to the substrate's score in relation to its group. In an embodiment, the actual classification may be a hard classification, with each substrate assigned to a single group, with the corresponding correction score weighted according to its score (e.g., its degree of membership) within that group. In an alternative embodiment, each substrate may be optionally assigned partial membership of multiple groups, with the score values used in the weighting of the corrections between the groups. In the latter example, some substrates may be classified in only a single group if the score value is particularly high (in absolute terms) for that group.

Figure 8:
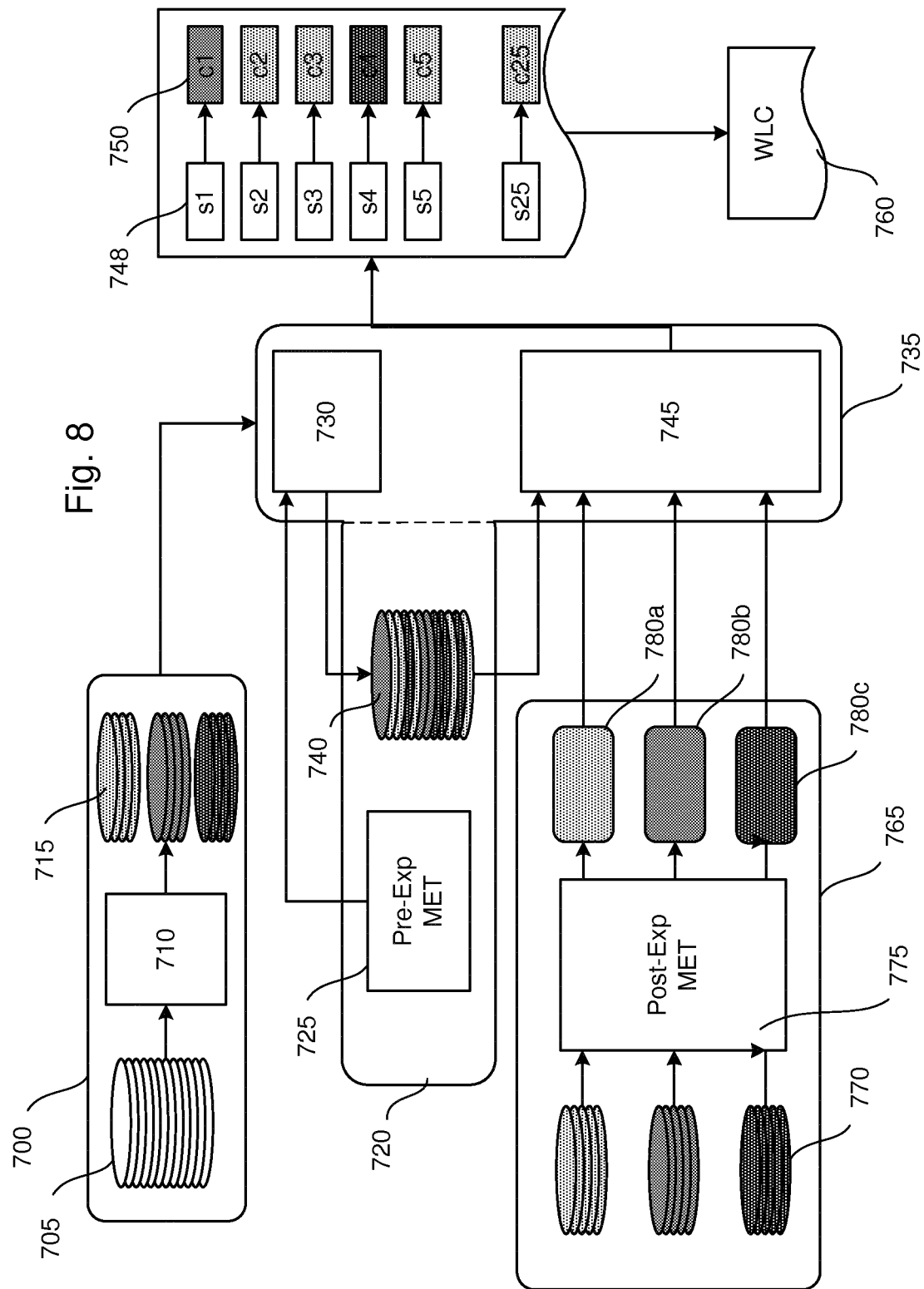
FIG. 8 is a flow diagram conceptually illustrating a method according to an embodiment of the invention.

FIG. 8 shows a flowchart conceptually describing a method according to a specific embodiment. A set-up phase 700 comprises obtaining historic training data for a plurality of substrates 705 and performing a clustering and classification step 710 to obtain a plurality of substrate groups 715. Within a lithographic apparatus 720, pre-exposure metrology 725 is performed. The resultant pre-exposure metrology data is processed 730 within processor 735, to assign each substrate to a substrate group 740 (which may include partially assigning a substrate to more than one substrate group, as appropriate). This step may optionally also comprise storing a score (or scores) associated with each substrate indicating the degree to which the substrate belongs to its assigned group (or groups). The processor 735 then assigns 745 a process correction 750 to each substrate 748 in accordance with the assigned class(es) and/or score(s). Processor 735 may be integrated with (e.g., form part of) lithographic apparatus 720 or may be a stand-alone processing module. At step 760, each assigned process correction 750 is used for wafer level control when exposing the next layer on that substrate. Within a metrology apparatus (such as a scatterometer) 765, one or more already categorized substrates 770 are measured post-exposure 775 (e.g., substrates which have been exposed prior to the plurality of substrates 705 being introduced to lithographic apparatus 720). For each substrate group, a correction update 780a, 780b, 780 is determined and fed to the processor 735 for use when the algorithm assigns a process correction 745. The correction update may be a weighted correction update based on group membership status of each substrate, particularly where a soft assignment method is used (e.g., a softmax method). The method may further comprise an optimization step (not shown) which optimizes the updated process corrections 750, such that pre-optimized process corrections are selected from when assigning process corrections at step 745 (one pre-optimized correction per class).

In this way, pre-exposure metrology data can be used in an automated solution for run-to-run wafer level control of a lithographic process without any requirement for processing history information to be tracked, nor offline measurements to be made.

It may be desirable to make an assessment of the clustering/classification of the methods described herein. In particular, it may be useful to assess how well substrates are related to a certain group of substrates, and whether, for example, pre-exposure metrology data is representative/useful to serve as a basis for the initial clustering of the substrates (e.g., how well does the pre-exposure metrology data correlate with post-exposure metrology data associated with the substrates).

This assessment may be made as part of a training phase, for example, set up phase 700 and more specifically clustering and classification step 710 and/or clustering steps 410, 420 and/or classification step 430. The assessment may comprise applying clustering algorithms (e.g., k-means, Gaussian mixture models, etc.) to determine k groups of substrates based on post-exposure metrology data and, separately, to determine j groups of substrates based on pre-exposure metrology data.

In an embodiment, the optimal number k and j can be determined automatically by using the Bayesian information criterion or similar model selection techniques. In such an embodiment, this may comprise finding the minimum of the Bayesian information criterion BIC, which may take the form:

$$BIC = -2 \cdot \ln\hat{L} + k \ln(n)$$

where $\hat{L}$ the maximized value of the likelihood function of the clustering model used, k is the number of model parameters and n is the number of samples.

In a specific example, the clustering model used on the pre-exposure metrology data and the post-exposure metrology data may be a Gaussian mixture model, e.g., a weighted sum of Gaussians multiplied by a prior probability. In a specific embodiment, this model p(x) might comprise:

$$p(x) = \sum_{i=0}^{k} \pi_i N\left(x \mid \mu_i, \sum_i\right)$$

where $$\sum_{i=0}^{k} \pi_i = 1,$$

x is the data being clustered, k is the number of components (clusters), $\mu_i$ is the mean and $\Sigma_i$ is the covariance of the component i.

It is proposed to apply a matching algorithm to match the k groups within the post-exposure metrology data to the j groups within the pre-exposure metrology data. This may comprise optimizing one or more matching metrics or key performance indicators (KPIs). Possible KPIs may include, for example, matching accuracy or purity. Assessing matching accuracy may comprise determining the correlation and/or area under the curve from a receiver operating characteristic (ROC) curve on a plot of true positive rate against false positive rate for different discrimination thresholds. Purity is a measure of similarity (e.g., in terms of their labels following classification) of the samples within a group. More specifically, for a set of groups $\Omega = \{\text{col}, (\omega_1, \omega_2, \ldots, \omega_K\}$ and set of labels $\mathbb{C} = \{c_1, c_2, \ldots, c_j\}$ then purity $(\Omega, \mathbb{C})$ may be defined as:

$$\text{purity}(\Omega, \mathbb{C}) = \frac{1}{N} \sum_k \max_j |\omega_k \cap c_j|$$

as such, purity of pre-exposure metrology data groups may comprise the homogeneity of the pre-exposure metrology data within each cluster with respect to its one or more matched post exposure metrology data cluster(s) (e.g., are all or most members of a pre-exposure cluster from only the post-exposure cluster(s) matched thereto and vice versa).

It might be expected that the number of k groups within the post-exposure metrology data and the j groups within the post-exposure metrology data will be the same; i.e., j=k. This would imply that pre-exposure metrology data induces the same groups as post-exposure metrology data. However, there are a number of reasons why this may not be the case, and that in fact j≠k. In the embodiments described, the matching algorithm matches the groups even when j≠k.

Figure 9:
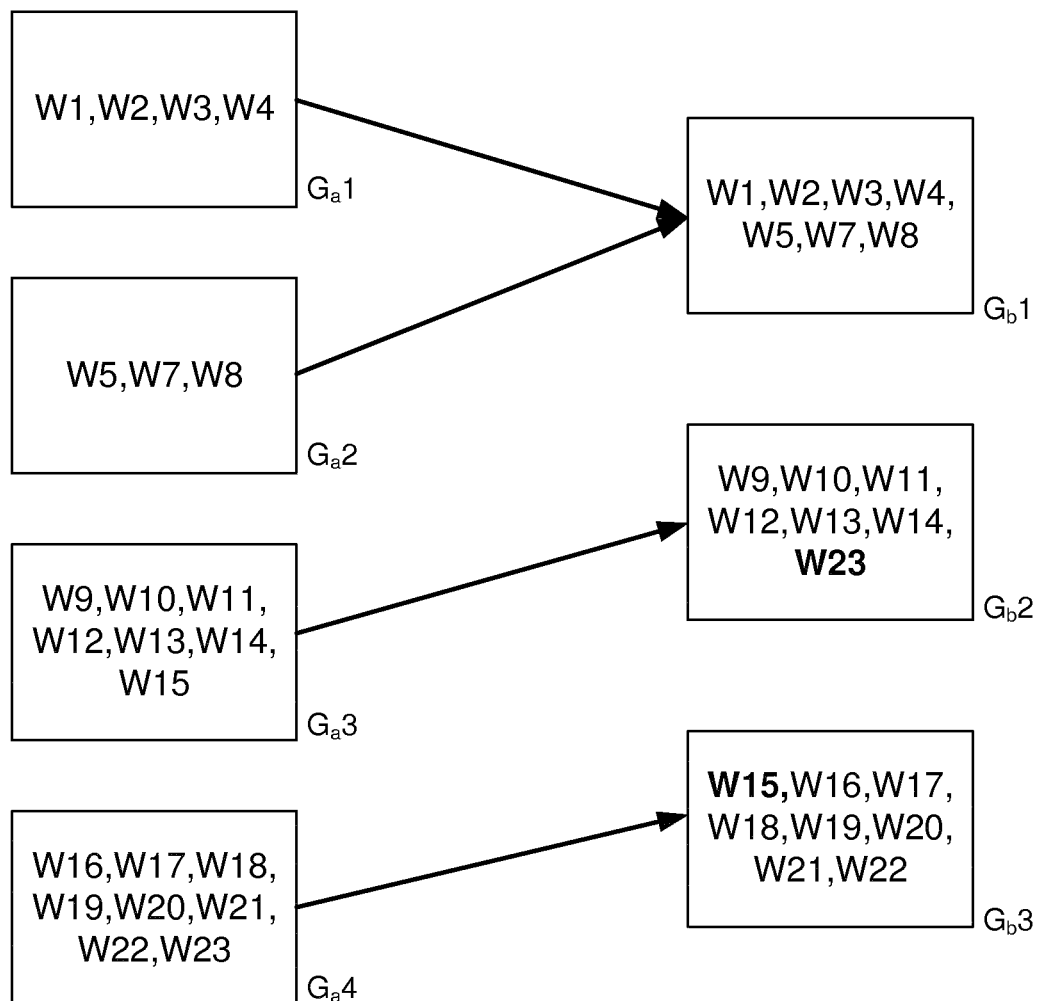
FIG. 9 conceptually illustrates exemplary substrate grouping of pre-exposure metrology data and post-exposure metrology data.

FIG. 9 shows an example where the clustering has revealed four pre-exposure metrology data groups $G_a1$-$G_a4$ and three post-exposure metrology data groups $G_b1$-$G_b3$. FIG. 9 also shows that the matching of groups $G_a1$ and $G_a2$ of the pre-exposure metrology data to group $G_b1$ of the post-exposure metrology data, group $G_a3$ of the pre-exposure metrology data to group $G_b2$ of the post-exposure metrology data, and group $G_a4$ of the pre-exposure metrology data to group $G_b3$ of the post-exposure metrology data.

In an embodiment, samples with uncertain group membership (e.g., outliers and/or samples close to a group or decision boundary) may be excluded from the grouping. For example, any samples which are within a certain distance (margin) from a decision boundary may be excluded. In a specific example, where w is a vector orthogonal to the decision boundary and b is a scalar offset term, then the decision boundary may be written as:

$$w^T x + b = 0$$

and the margin may be defined as anywhere within:

$$(w^T x_i + b) y_i > c$$

where c determines the size of the margin either side of the decision boundary. In another embodiment, where a weighted classification is used (as already described), then the weighting assigned to a substrate may be used to determine an uncertain group membership and therefore whether a particular substrate may be excluded. FIG. 9 shows an example where two substrates W23, W15 with uncertain group status have been included. Because of the uncertainty in their group status, they have been incorrectly assigned to the incorrect post-exposure metrology groups: substrate W23 has been assigned to group $G_b2$ instead of $G_b3$ and substrate W15 has been assigned to group $G_b3$ instead of $G_b2$. It is proposed that these substrates may be excluded altogether or given a lesser weighting based on their uncertain status.

In an embodiment, an initial step of removing irrelevant, or less relevant features is performed, such that the clustering is performed only on pre-exposure features related to post-exposure metrology variation. Irrelevant features will increase the number of groups required and will result in low matching quality which may not be significantly better than random. In an embodiment, the number of dimensions of the pre-exposure metrology data may be limited to two. For example, having only two-dimensional data will typically mean that far fewer groups will be required. By way of a specific example, it was shown on a test dataset that only three groups were required for two-dimensional data, while adding another dimension required eight groups. It should be appreciated that the actual number of groups required in each case will depend on the dataset.

During a validation phase, a KPI may be determined which describes the matching quality. This may comprise determining the statistical significance of the grouping performance. For example, a p-value may be calculated, which indicates whether the quality of the group matching is significantly better (e.g., better by a threshold margin) than random. If it is determined that the group matching quality is not significantly better than random, this might indicate that the pre-exposure metrology data does not adequately explain the substrate-to-substrate variation observed in the post-exposure metrology data. If this is the case, the aforementioned steps may be repeated using a different type of pre-exposure metrology data or a different type of pre-exposure parameter data (e.g., alignment, levelling, process history, etc.). Another reason why the group matching quality may not be significantly better than random is that the clustering algorithm might not be working effectively on the dataset. If none of the available clustering algorithms or pre-exposure measures lead to statistically significant group matching performance, it may be inferred that that cluster-based control should not be used in the current substrate production scenario. On the other hand, when the KPIs indicate good, statistically significant, grouping performance then the cluster-based control strategy may be activated in production.

In another embodiment, the concepts described herein can be used for correction between patterning steps of a multiple patterning process such as an LELE (litho-etch-litho-etch) process. In such an embodiment, the pre-exposure parameter data may comprise context data relating to a processing context used.

In a practical sense, there may be a large number of different context variables (context parameters) involved. Each processing tool, processing chamber and processing recipe, for example, can be considered to be a separate context. As such, the number of context combinations may be extremely large. The logistics of monitoring each unique context combination is not always practical.

It is therefore proposed, in a specific embodiment, that the context data on which control is based on is limited to the etch chamber used in the etch step immediately preceding a previous lithography step. An etch tool can have multiple chambers (typically up to 4), resulting in a limited set of unique context values (corresponding to the number of etch chambers). By tracking which etch chamber is used to process each substrate, the substrates of each lot can be classified into (e.g., four) groups. For each group, a separate WLC control can then be determined. These WLC corrections may be added to the 'normal' (APC) corrections applied in lot-to-lot control. In multiple patterning applications generally, it is typically advised to use the same corrections for each patterning (litho-etch) step. The proposal described in this embodiment improves the intra-layer "overlay" (between each litho step of a layer), by proposing a context based wafer-level control on the difference between layer position of both layers.

Figure 10:
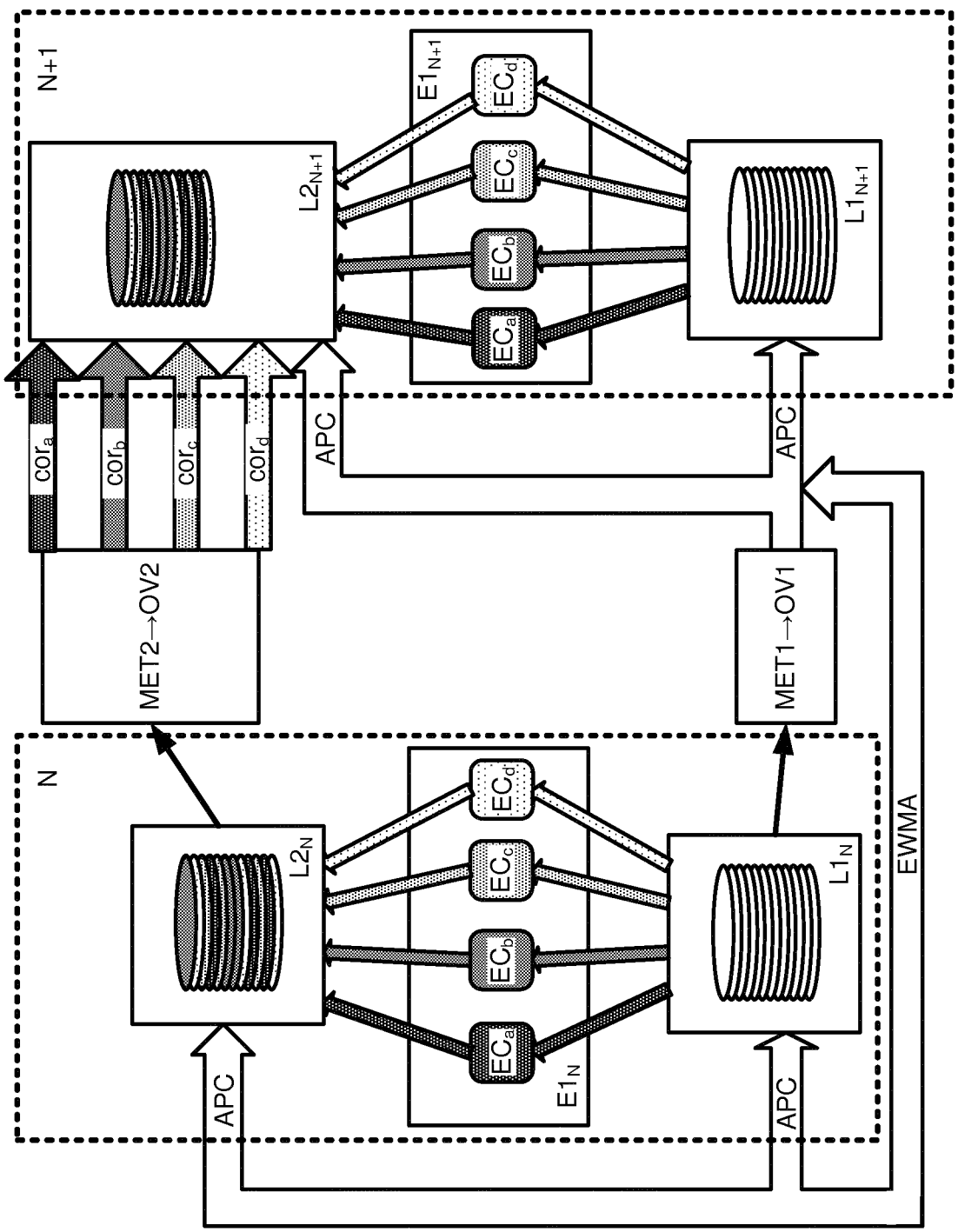
FIG. 10 is a flow diagram conceptually illustrating a method according to an embodiment of the invention.

FIG. 10 is a flow diagram which illustrates such an embodiment. The example here shows a double patterning LELE process, where each layer is exposed in two separate litho-etch steps. The embodiment is applicable to multiple patterning processes more generally, however, including those with more than two separate litho-etch steps. In an initial lot, lot N, a first patterning step is performed $L1_N$. The first patterning step $L1_N$ may be performed with a correction determined using APC control loops, based on measurement of one or more previous lots, as already described. Following the first patterning step, a first etch step $E1_N$ is performed. In this first etch step $E1_N$, each substrate is etched in one of (for example) four etch chambers $EC_a$-$EC_d$. The etch chamber used to etch each substrate is recorded (as the relevant context) and each substrate is assigned to a group corresponding to the etch chamber used. Additionally one or more of the patterned substrates following patterning step $L1_N$ are measured in a first measurement step MET1 using a metrology device. In a specific embodiment at least two are measured, one per chuck, to obtain a per-chuck measurement. The first measurement step may comprise measurement of a first overlay fingerprint OV1 for example. Following the first patterning step $L1_N$ and first etch step $E1_N$, a second patterning step $L2_N$ is performed with the same APC correction as that performed for the first patterning step $L1_N$. Following second patterning step $L2_N$, a second measurement step MET2 is performed using the metrology device. In the second metrology step MET2, at least one substrate per group is measured (and also, optionally, per chuck). The second measurement step may comprise measurements of a second overlay fingerprint OV2 per group (or class/chuck combination), for example. The difference between second overlay fingerprint OV2 and first overlay fingerprint OV1 can then be calculated and used to determine an intra-layer correction $cor_a$-$cor_d$ for each substrate group (second corrections). The intra-layer correction $cor_a$-$cor_d$ may be such that their application minimizes the difference between second overlay fingerprint OV2 and first overlay fingerprint OV1.

In a subsequent lot, such as lot N+1, the first patterning step $L1_{N+1}$ and first etch step $E1_{N+1}$ is performed in a manner similar as that performed for lot N, using the "standard" APC correction, as appropriate (a first correction). This may include an exponentially weighted moving average EWMA of previous measurements. As before, the etch chamber (context) used in etch step $E1_{N+1}$ is tracked. Based on this context, the appropriate one of corrections $cor_a$-$cor_d$ for the group corresponding to that context is selected. This (second) correction is used with the APC (first) correction when performing a second patterning step $L2_{N+1}$, following which a second etch step (not shown) will be performed. In this way, the final double patterned (LELE) layer will look more like a single exposure, from an overlay perspective.

It will be appreciated that, in principle, this concept can be extended to more complex context threads than that illustrated (etch chambers) and to parameters other than overlay (for example CD or edge placement error (EPE)).

Further embodiments of the invention are disclosed in the list of numbered embodiments below:
1. A method of determining a correction for a process parameter related to a lithographic process on a substrate, the lithographic process comprising a plurality of runs during each one of which a pattern is applied to one or more substrates, the method comprising:
   obtaining pre-exposure parameter data relating to a property of the substrate;
   obtaining post-exposure metrology data comprising one or more measurements of the process parameter having been performed by an equivalent lithographic process on one or more previously exposed substrates of the lithographic process;
   assigning to the substrate, a group membership status from one or more groups, based on the pre-exposure parameter data; and
   determining the correction for the process parameter based on the group membership status and the post-exposure metrology data.
2. A method according to embodiment 1, comprising performing the lithographic process on the substrate using the correction.
3. A method according to embodiment 1 or 2, wherein the pre-exposure parameter data comprises pre-exposure metrology data.
4. A method according to embodiment 3, comprising performing a pre-exposure metrology step on the substrate to obtain the pre-exposure metrology data.
5. A method according to embodiment 4, wherein the pre-exposure metrology step, and a subsequent step of performing the lithographic process on the substrate using the correction is performed by the same lithographic apparatus.
6. A method according to embodiment 5, wherein the steps of assigning a group membership status and determining the correction for the process parameter are also performed by the same lithographic apparatus.
7, A method according to any of embodiments 3 to 6, wherein the pre-exposure metrology data comprises alignment data describing across-substrate grid distortions in the substrate plane.
8. A method according to any of embodiments 3 to 7, wherein the pre-exposure metrology data comprises data describing the shape of the substrate in a direction perpendicular to the substrate plane.
9. A method according to any of embodiments 3 to 8, wherein the pre-exposure metrology data comprises leveling data.
10. A method according to any of embodiments 3 to 9, comprising the step of identifying for a particular group, a substrate which is most representative of the group.
11. A method according to embodiment 10, comprising measuring the substrate which is most representative of the group; and updating a correction for the process parameter corresponding to the group based on the measurement.
12. A method according to any of embodiments 3 to 11, wherein the group membership status is such that each substrate may be assigned a degree of membership to one or more of the groups.
13. A method according to embodiment 12, wherein the step of determining the correction for the process parameter is based on weighing of corrections associated with one or more groups based on the degrees of membership of that substrate to the one or more groups.
14. A method according to embodiment 13, wherein the degree of membership to a group is based on a classification score representative of the measure of the presence of a fingerprint defining that group in the pre-exposure metrology data.
15 A method according to embodiment 14, wherein the assigning step comprises performing a principal component analysis on the pre-exposure metrology data to identify the presence of one or more eigenfingerprints in the pre-exposure metrology data and the classification score representative of the measure of the presence of a corresponding eigenfingerprint(s) in the pre-exposure metrology data.
16. A method according to embodiment 14 or 15, comprising an initial training stage wherein the one or more groups are determined from a principal component analysis performed on the pre-exposure metrology data, each group being defined by an eigenfingerprint determined from the principal component analysis.
17. A method according to any of embodiments 3 to 14, comprising an initial training stage wherein the one or more groups are determined.
18. A method according to embodiment 17, wherein the one or more groups are determined from a plurality of labeled sets of the pre-exposure metrology data, each labeled set relating to a different substrate of a plurality of substrates and labeled by post-exposure metrology data relating to that substrate.
19. A method according to embodiment 18, wherein the initial training stage comprises performing a supervised or semi-supervised classification algorithm which trains a classifier on at least the labeled sets of pre-exposure metrology data so as to define the one or more groups.
20. A method according to any of embodiments 17 to 19, wherein the initial training stage comprises the steps of identifying pre-exposure groups in the pre-exposure metrology data.

21. A method according to embodiment 20, wherein the step of identifying pre-exposure groups comprises identifying intra-lot groups and identifying inter-lot groups.
22. A method according to embodiment 20 or 21, wherein the initial training stage comprises the steps of identifying post-exposure groups in the post-exposure metrology data.
23. A method according to embodiment 22, comprising a step of matching the post-exposure groups to the pre-exposure groups by optimizing at least one matching metric related to a quality of the matching.
24. A method according to embodiment 23, wherein the matching metric comprises one or more of:
   purity of the pre-exposure groups and/or post-exposure groups in terms of homogeneity across each group; and
   correlation and/or area under a curve as determined from a receiver operating characteristic curve describing the groups for different discrimination thresholds.
25. A method according to embodiment 23 or 24, wherein it is determined whether the statistical significance of the matched groups described by the matching metric is significantly greater than random.
26. A method according to embodiment 25, wherein, where it is determined that the statistical significance of the matched groups described by the matching metric is not significantly greater than random, repeating the training stage using a different type of pre-exposure metrology data.
27. A method according to any of embodiments 23 to 26, wherein substrates which have uncertain group membership status are excluded from, or given lesser weighting in, the matching step.
28. A method according to any of embodiments 23 to 27, wherein the matching step is performed only on pre-exposure features within the pre-exposure data related to post-exposure metrology variation.
29. A method according to any of embodiments 22 to 28, comprising optimizing separately the number of pre-exposure groups and post-exposure groups.
30. A method according to any of embodiments 17 to 29, wherein the initial training stage comprises a validation step comprising assigning substrates to the one or more groups based on historic data and simulating the effect on the post-exposure metrology data.
31. A method according to any of embodiments 17 to 30, wherein the post-exposure metrology data comprises overlay data.
32. A method according to any of embodiments 1 to 11, wherein the group membership status is such that each substrate is always assigned to a single group, or else is unclassified.
33. A method according to any preceding embodiment, wherein pre-exposure metrology data comprises data relating to a previously exposed layer on the substrate.
34. A method according to any of embodiments 1 to 32, wherein pre-exposure metrology data comprises data relating to a layer to be exposed on the substrate in a subsequent step of the lithographic process.
35. A method according to embodiment 1 or 2, wherein the pre-exposure parameter data comprises context data relating to a particular processing step.
36. A method according to embodiment 35, wherein the context data relates to a tool used on a processing step for processing the substrate.
37. A method according to embodiment 36, wherein the context data relates to a particular etch chamber used during an etch step and each group corresponds to one of the etch chambers.
38. A method according to embodiment 35, 36 or 37, wherein the lithographic process comprises a multiple patterning process having at least a first patterning and etch step and a second patterning and etch step per layer.
39. A method according to embodiment 38, wherein the correction comprises a second correction relative to a first correction, the method comprising the steps of:
   performing a first patterning and etch step with the first correction;
   determining the context applicable to the first patterning and etch step;
   assigning the group membership status to the substrate based on the context determination; and
   determining the second correction for the second patterning and etch step based on the group membership status and the first correction.
40. A method according to embodiment 39, comprising performing for each group, the initial steps of:
   obtaining first process parameter data relating to a first measurement of the process parameter between the first patterning and etch step and the second patterning and etch step;
   obtaining second process parameter data relating to a second measurement of the process parameter subsequent to the second patterning and etch step; and
   calculating the second correction based on the difference between the first process parameter data and the second process parameter data.
41. A method according to embodiment 40, wherein the second correction is calculated to minimize the difference between the first process parameter data and the second process parameter data for each group.
42. A method according to any preceding embodiment, wherein the process parameter comprises overlay.
43. A method according to any of embodiments 1 to 41, wherein the process parameter comprises one of critical dimension and edge placement error.
44. A method according to any preceding embodiment, wherein the step of determining the correction for the process parameter based on the group membership status also determines the correction for the process parameter based on which chuck the substrate is mounted on during the lithographic process.
45. A method according to any preceding embodiment, comprising measuring the substrate post-exposure to obtain post-exposure measurements of the substrate; and using the post-exposure measurements of the substrate to update the correction(s) for the process parameter corresponding to the group membership status assigned to the substrate.
46. A method according to any preceding embodiment, wherein, where it is determined that the pre-exposure metrology data is of an insufficient fit to any of the one or more groups according to a metric, the method comprises updating the one or more groups such that the pre-exposure metrology data can be classified.
47. A method according to embodiment 46, wherein the step of updating the one or more groups comprises maintaining the same number of groups, and updating a data characteristic defining one or more of the groups, such that the pre-exposure metrology data for this substrate is a sufficient fit for at least one of the groups according to the metric.
48. A method according to embodiment 46, wherein the step of updating the one or more groups comprises adding a new group defined by a data characteristic having an improved fit to the substrate relative to the other groups.

49. A method according to any preceding embodiment, comprising performing the method for each substrate of a run.

50. A method according to embodiment 49, wherein the post-exposure metrology data comprises one or more measurements of the process parameter having been performed by an equivalent lithographic process on one or more previously exposed substrates of the same run of the lithographic process.

51. A method according to embodiment 49, wherein the post-exposure metrology data comprises one or more measurements of the process parameter having been performed by an equivalent lithographic process on one or more previously exposed substrates of a previous run of the lithographic process.

52. A method of manufacturing devices wherein device features are formed on a series of substrates by a patterning process, wherein corrections for a process parameter of the patterning process are determined by performing the method of any of embodiments 1 to 51 and 56 to 64.

53. A control system for a lithographic apparatus, the control system comprising: storage for receiving pre-exposure parameter data relating to a property of a substrate and post-exposure metrology data comprising one or more measurements of the process parameter having been performed on one or more previous substrates; and a processor operable to:
   assign to the substrate, a group membership status from a one or more groups, based on the pre-exposure parameter data; and
   determine a correction for a process parameter based on the group membership status and the post-exposure metrology data.

54. A control system according to embodiment 53, wherein the pre-exposure parameter data comprises pre-exposure metrology data.

55. A control system according to embodiment 54, wherein the pre-exposure metrology data comprises alignment data describing across-substrate grid distortions in the substrate plane.

56. A control system according to embodiment 54 or 55, wherein the pre-exposure metrology data comprises data describing the shape of the substrate in a direction perpendicular to the substrate plane.

57. A control system according to any of embodiments 54 to 56, wherein the pre-exposure metrology data comprises leveling data.

58. A control system according to any of embodiments 54 to 57, wherein the processor is operable to assign the group membership status such that each substrate may be assigned a degree of membership to one or more of the groups.

59. A control system according to embodiment 58, wherein the correction is determined for the process parameter based on weighing of corrections associated with one or more groups based on the degrees of membership of that substrate to the one or more groups.

60. A control system according to embodiment 59, wherein the degree of membership to a group is based on a classification score representative of the measure of the presence of a fingerprint defining that group in the pre-exposure metrology data.

61. A control system according to embodiment 60, wherein the processor is operable to perform a principal component analysis on the pre-exposure metrology data to identify the presence of one or more eigenfingerprints in the pre-exposure metrology data and the classification score representative of the measure of the presence of a corresponding eigenfingerprint(s) in the pre-exposure metrology data.

62. A control system according to any of embodiments 54 to 61, wherein the processor is operable to determine for a particular group, a substrate which is most representative of the group.

63. A control system according to embodiment 62, wherein the processor is operable to update a correction for the process parameter corresponding to the group based on a measurement of the substrate which is most representative of the group.

64. A control system according to any of embodiments 53 to 57, wherein the processor is operable to assign the group membership status such that each substrate is always assigned to a single group, or else is unclassified.

65. A control system according to any of embodiments 53 to 64, wherein pre-exposure metrology data comprises data relating to a previously exposed layer on the substrate.

66. A control system according to any of embodiments 53 to 64, wherein pre-exposure metrology data comprises data relating to a layer to be exposed.

67. A control system according to embodiment 53, wherein the pre-exposure parameter data comprises context data relating to a particular processing step.

68. A control system according to embodiment 67, wherein the context data relates to a tool which has been used when processing the substrate.

69. A control system according to embodiment 67 or 68, operable to control the lithographic apparatus to perform a multiple patterning process having at least a first patterning step and a second patterning step per layer.

70. A control system according to embodiment 69, wherein the context data relates to a particular etch chamber that has been used to etch the substrate between the first patterning step and second patterning step, and each group corresponds to one of the etch chambers.

71. A control system according to embodiment 70, wherein the correction comprises a second correction relative to a first correction, and the control system is operable to control the lithographic apparatus to:
   perform a first patterning step with a first correction;
   determine the context applicable to the first patterning step;
   assign the group membership status to the substrate based on the context determination; and
   determine the second correction for the second patterning step based on the group membership status and the first correction.

72. A control system according to embodiment 71, the control system being operable to control the lithographic apparatus to, for each class:
   obtain first process parameter data relating to a first measurement of the process parameter between the first patterning step and the second patterning step;
   obtain second process parameter data relating to a second measurement of the process parameter subsequent to the second patterning step; and
   calculate the second correction based on the difference between the first process parameter data and the second process parameter data.

73. A control system according to embodiment 72, operable such that the second correction is calculated to minimize the difference between the first process parameter data and the second process parameter data for each group.

74. A control system according to any of embodiments 53 to 73, wherein the process parameter comprises overlay.

75. A control system according to any of embodiments 53 to 74, wherein the process parameter comprises one of critical dimension and edge placement error.

76. A control system according to any of embodiments 53 to 75, wherein the correction determined for the process parameter based on the group membership status is also based on which chuck the substrate is mounted on during the lithographic process.

77. A control system according to any of embodiments 53 to 76, wherein the processor is operable to use post-exposure measurements of the substrate to update the correction(s) for the process parameter corresponding to the group membership status assigned to the substrate.

78. A control system according to any of embodiments 53 to 77, wherein, where the processor determines that the pre-exposure metrology data is of an insufficient fit to any of the one or more groups according to a metric, the processor is operable to update the one or more groups such that the pre-exposure metrology data can be classified.

79. A control system according to embodiment 78, wherein updating of the one or more groups comprises maintaining the same number of groups, and updating a data characteristic defining one or more of the groups, such that the pre-exposure metrology data for this substrate is a sufficient fit for at least one of the groups according to the metric.

80. A control system according to embodiment 78, wherein the updating of the one or more groups comprises adding a new group defined by a data characteristic having an improved fit to the substrate relative to the other groups.

81. A control system operable to control a suitable apparatus to perform the method of any of embodiments 1 to 52 and 86 to 94.

82. A lithographic apparatus comprising the control system according to any of embodiments 43 to 81.

83. A lithographic apparatus according to embodiment 82 comprising a measurement system, a patterning system and a control system, the measurement system being operable to perform pre-exposure metrology on the substrate to obtain the pre-exposure metrology data, and the patterning system being operable to form device features on the substrate in a patterning process using the correction for a process parameter of the patterning process.

84. A computer program product containing one or more sequences of machine-readable instructions for implementing the steps of a method of any of embodiments 1 to 52 and 86 to 94.

85. A computer program product containing one or more sequences of machine-readable instructions for causing a processing device or system of processing devices to implement the control system of any of embodiments 53 to 81.

86. A method of dynamically updating one or more groups and/or corrections for a process parameter related to a lithographic process on a substrate, wherein a correction out of a plurality of corrections is applied to the process parameter for each substrate based on a group membership status assigned to that substrate the method comprising:
 obtaining post-exposure metrology data describing a performance parameter of the substrate; and
 dynamically updating the one or more of the groups and/or plurality of corrections based on the post-exposure metrology data.

87. A method according to embodiment 86, wherein the post-exposure metrology data comprises overlay data.

88. A method according to embodiment 86 or 87, wherein the dynamically updating step comprises dynamically updating corrections for a process parameter corresponding to a group based on a measurement of a substrate which is determined to be most representative of the group.

89. A method according to any of embodiments 86 to 88, wherein the dynamically updating step comprises updating the one or more corrections of the plurality of corrections which correspond to the group membership status of the substrate.

90. A method according to any of embodiments 86 to 89, wherein the dynamically updating step comprises applying a weighted update to the plurality of corrections based on the group membership status of the substrate.

91. A method according to any of embodiments 86 to 90, comprising the steps of obtaining pre-exposure metrology data describing a property of each substrate;
 assigning to the substrate, a group membership status from a one or more
 groups, based on the pre-exposure metrology data; and
   determining the correction for the process parameter based on the group membership status.

92. A method according to embodiment 91, wherein, where it is determined that the pre-exposure metrology data is of an insufficient fit to any of the one or more groups according to a metric, the dynamically updating step comprises dynamically updating the one or more groups such that the pre-exposure metrology data can be classified.

93. A method according to embodiment 92, wherein the step of dynamically updating the one or more groups comprises maintaining the same number of groups, and updating a data characteristic defining one or more of the groups, such that the pre-exposure metrology data for this substrate is a sufficient fit for at least one of the groups according to the metric.

94. A method according to embodiment 92, wherein the step of dynamically updating the one or more groups comprises adding a new group defined by a data characteristic having an improved fit to the substrate relative to the other groups.

In association with the hardware of the lithographic apparatus and the lithocell LC, an embodiment may include a computer program containing one or more sequences of machine-readable instructions for causing the processors of the lithographic manufacturing system to implement methods of model mapping and control as described above. This computer program may be executed for example in a separate computer system employed for the image calculation/control process. Alternatively, the calculation steps may be wholly or partly performed within a processor a metrology tool, and/or the control unit LACU and/or supervisory control system SCS of FIGS. 1 and 2. There may also be provided a data storage medium (e.g., semiconductor memory, magnetic or optical disk) having such a computer program stored therein in non-transient form.

Although specific reference may have been made above to the use of embodiments of the invention in the context of optical lithography, it will be appreciated that embodiments of the invention may be used in other patterning applications, for example imprint lithography. In imprint lithography, topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for dividing a plurality of substrates into groups associated with group specific corrections for a lithographic apparatus, the method comprising:
   obtaining pre-exposure data and post-exposure data associated with the plurality of substrates; and
   clustering, by a hardware computer system, the substrates using separately the pre-exposure data and post-exposure data to obtain a first set of groups within the plurality of substrates associated with the pre-exposure data and a second set of groups within the plurality of substrates associated with the post-exposure data, wherein the clustering provides:
   i) an optimized number of groups within the first set of groups and the second set of groups; and/or
   ii) matching of the first set of groups with the second set of groups based on optimization of a matching metric.

2. The method of claim 1, wherein the plurality of substrates is a lot of wafers.

3. The method of claim 1, wherein the pre-exposure data comprises one or more selected from: alignment measurement data, leveling data, substrate topography data, substrate geometry data or substrate flatness data.

4. The method of claim 1, wherein the post-exposure data comprises one or more selected from: overlay, critical dimension or focus values.

5. The method of claim 1, wherein the clustering is based on a k-means clustering or a Gaussian mixture model.

6. The method of claim 1, wherein the clustering optimizes the number of groups within the first set of groups and the second set of groups using a Bayesian Information Criterion (BIC).

7. The method of claim 1, wherein the clustering provides matching of the first set of groups with the second set of groups and the matching metric is based on a matching accuracy.

8. The method of claim 7, wherein the matching accuracy is based on the area under the curve from a Receiver Operating Characteristic (ROC) curve.

9. The method of claim 1, wherein the clustering algorithm provides matching of the first set of groups with the second set of groups and the matching metric is based on a purity metric representing similarity of substrates within a group out of the first and/or second set of groups.

10. The method of claim 1, wherein the clustering algorithm provides matching of the first set of groups with the second set of groups and the matching metric comprises key performance indicator comprising a p-value.

11. The method of claim 10, further comprising using the value of the key performance indicator to select one or more types of data and/or one or more parameters, for inclusion into the pre-exposure data.

12. The method of claim 1, further comprising reducing dimensionality of features comprised within the pre-exposure data before the clustering.

13. The method of claim 12, wherein the dimensionality of the features is reduced to two.

14. The method of claim 1, wherein the number of groups within the first set of groups and the second set of groups are different.

15. A computer program product comprising a non-transitory computer-readable medium having instructions therein, the instructions, upon execution by a computer system, configured to cause the computer system to at least:
   obtain pre-exposure data and post-exposure data associated with a plurality of substrates; and
   cluster the substrates using separately the pre-exposure data and post-exposure data to obtain a first set of groups within the plurality of substrates associated with the pre-exposure data and a second set of groups within the plurality of substrates associated with the post-exposure data, wherein the clustering is configured to provide:
   i) an optimized number of groups within the first set of groups and the second set of groups; and/or
   ii) matching of the first set of groups with the second set of groups based on optimization of a matching metric.

16. The computer program product of claim 15, wherein the clustering is based on k-means clustering or a Gaussian mixture model.

17. The computer program product of claim 15, wherein the clustering is configured to optimize the number of groups within the first set of groups and the second set of groups using a Bayesian Information Criterion (BIC).

18. The computer program product of claim 15, wherein the clustering is configured to provide matching of the first set of groups with the second set of groups and the matching metric is based on a matching accuracy.

19. The computer program product of claim 15, wherein the clustering is configured to provide matching of the first set of groups with the second set of groups and the matching metric is based on a purity metric representing similarity of substrates within a group out of the first and/or second set of groups.

20. The computer program product of claim 15, wherein the instructions are further configured to cause the one or more processors to reduce dimensionality of features comprised within the pre-exposure data before the clustering.

* * * * *